United States Patent
Groenhuis et al.

(10) Patent No.: US 7,944,062 B2
(45) Date of Patent: May 17, 2011

(54) AIR CAVITY PACKAGE FOR A SEMICONDUCTOR DIE AND METHODS OF FORMING THE AIR CAVITY PACKAGE

(75) Inventors: Roelf Anco Jacob Groenhuis, Nijmegen (NL); Paul Dijkstra, Eindhoven (NL)

(73) Assignee: NXP B.V., Eindhoven (NL)

( * ) Notice: Subject to any disclaimer, the term of this patent is extended or adjusted under 35 U.S.C. 154(b) by 369 days.

(21) Appl. No.: 12/092,121

(22) PCT Filed: Oct. 27, 2006

(86) PCT No.: PCT/IB2006/053962
§ 371 (c)(1),
(2), (4) Date: Apr. 30, 2008

(87) PCT Pub. No.: WO2007/052198
PCT Pub. Date: May 10, 2007

(65) Prior Publication Data
US 2008/0272475 A1    Nov. 6, 2008

Related U.S. Application Data

(60) Provisional application No. 60/732,680, filed on Nov. 1, 2005.

(51) Int. Cl.
*H01L 23/28* (2006.01)
(52) U.S. Cl. .......... 257/787; 257/701; 438/127
(58) Field of Classification Search .......... 257/787, 257/701, 786; 438/112, 124, 127
See application file for complete search history.

(56) References Cited

U.S. PATENT DOCUMENTS

| | | | |
|---|---|---|---|
| 6,384,472 B1 | 5/2002 | Huang | |
| 6,858,474 B1 | 2/2005 | Koay et al. | |
| 7,109,570 B2 * | 9/2006 | Manalac et al. | 257/666 |
| 7,176,582 B2 | 2/2007 | Kloen et al. | |
| 7,247,938 B2 | 7/2007 | Groenhuis et al. | |
| 7,732,937 B2 * | 6/2010 | Goller et al. | 257/787 |
| 2002/0074672 A1 | 6/2002 | Huang | |
| 2003/0102540 A1 | 6/2003 | Lee | |
| 2004/0262781 A1 * | 12/2004 | Germain et al. | 257/787 |
| 2006/0191215 A1 * | 8/2006 | Stark | 52/204.6 |
| 2006/0197207 A1 * | 9/2006 | Chow et al. | 257/686 |
| 2008/0067698 A1 * | 3/2008 | Do et al. | 257/787 |
| 2008/0157402 A1 * | 7/2008 | Ramakrishna et al. | 257/787 |

* cited by examiner

Primary Examiner — S. V Clark (57) ABSTRACT

A die package (72) for a semiconductor die (20). A plurality of the die packages (72) are formed on a single carrier (10) by applying a body (55) of molding compound across a carrier (10) with an air cavity (70) defined in the molding compound about each of a plurality of device regions (12) of the carrier (10). After a semiconductor die (20) is attached inside the air cavity (70) of each device region (12) and electrically connected with at least one contact pad (14, 16, 18), a cover (68) is applied to close all of the air cavities (70). Following singulation, each semiconductor die (20) is located inside the sealed air cavity (70) of one die package (72). The molding compound of each die package (72) may be locked against movement relative to the device region (12) of the carrier (10) by locking features (30, 38, 48, 50). The locking features (30, 38, 48, 50) may constitute portions of contact pads (14, 16, 18) used to establish electrical communication paths from the semiconductor die (20) to the environment outside of the package (72).

25 Claims, 5 Drawing Sheets

AIR CAVITY PACKAGE FOR A SEMICONDUCTOR DIE AND METHODS OF FORMING THE AIR CAVITY PACKAGE

The present invention relates generally to die packaging and, in particular, air cavity packages for semiconductor die.

Semiconductor die or chips carrying an integrated circuit may be packaged into a die package and then surface mounted to a substrate, such as a printed wiring board (PWB) or printed circuit board (PCB), to form an electronic assembly. A common type of die package is a surface mount device (SMD) that includes contact pads that are connected by solder bonding to complementary contact pads on the printed wiring board. The die package is manipulated by a placement machine onto a specified location on the printed wiring board and subsequently coupled electrically by solder bonds to the printed wiring board. The printed wiring board provides both the physical structure for mounting and holding the die package as well as a pattern of conductive traces extending from the contact pads to electrically interconnect the semiconductor die inside the die package with other components mounted to the printed wiring board, such as discrete passive components or other semiconductor chips. These additional components include circuitry used for supplying power to, controlling, or otherwise interacting electronically with the integrated circuit of the semiconductor die inside the die package.

To form a die package, the semiconductor die is mounted to a front side of a metal carrier, such as a leadframe. Conductive paths are established between contact or bond pads on the semiconductor die and contact or bond pads also on the front side of the carrier. One approach for establishing these conductive paths is a wire bonding process in which individual leads extend from the chip bond pads outwardly beyond the peripheral edges of the chip to the carrier bond pads. The leads, which are defined by fine wire, are bonded at each opposite end to the corresponding bond pads. The conductive paths established by the leads and bond pads supply chip-to-carrier interconnections for power and signal distribution. The coupled semiconductor die and carrier are encapsulated in a protective body of molding material to form a sealed package that protects the semiconductor die and leads. The carrier contact pads are exposed by the encapsulated package for mounting the package to a printed wiring board.

Air cavity packages are frequently used to package high frequency (e.g., radio-frequency or RF) semiconductor chips. Packaging the high frequency semiconductor chip in an envelope of encapsulated air improves the high frequency properties of the chip and its leads, as opposed to being encapsulated in molding compound. Dry air has a considerably lower dielectric constant than molding compounds, which improves electrical performance of the high frequency semiconductor chip.

Conventional surface mount air cavity packages are formed by initially bonding a molded bottom and sidewalls consisting of a molding compound to the metallic carrier to define a package body. The sidewalls are applied as a preformed frame that peripherally surrounds a die attach pad to which the semiconductor die is attached. Leads pass through the sidewalls or bottom for establishing communication paths with the semiconductor die. The leads have surfaces or ends that extend into the space enclosed by the sidewalls and, thus, are accessible inside the air cavity for wire bonding. The molded bottom and sidewalls partially bound the air cavity but leave the top open for attaching the semiconductor die to the die attach pad and then wire bonding leads from the chip bond pads to the leads extending through the sidewall. After the wire bonding process is completed, a lid is adhesively bonded with the sidewalls to close off the open top of the air cavity and, thereby, to provide environmental and mechanical protection for the die and wire leads without touching either of these components. The air cavity package is then attached to a carrier and encapsulated in a protective body of molding compound.

Conventional air cavity packaging processes suffer from various disadvantages. For example, each air cavity is closed by a discrete lid that must be individually picked and placed into position after die attach and wire bonding. Conventional air cavity packaging has limitations on dimensional shrinking such that small air cavity packages are difficult to fabricate. In addition, the air cavity package is formed separately and then mounted to the carrier and molded inside a protective body of molding compound, which requires multiple process steps to accomplish.

What is needed, therefore, is a method for forming an air cavity package that overcomes the disadvantages of conventional packaging methods.

In one embodiment of the invention, a die package comprises a semiconductor die, a carrier supporting the semiconductor die, and a body of molding compound arranged about the semiconductor die to at least partially bound an air cavity for the semiconductor die. The carrier includes a plurality of contact pads each having a first surface coupled electrically with the semiconductor die and a second surface coupled electrically with the first surface. The contact pads define a plurality of locking features surrounding the semiconductor die. The body is disposed on the carrier such that the second surface of each of the contact pads is externally exposed from the die package. The body is coupled mechanically with the locking features for securing the molding compound to the carrier.

In another aspect of the present invention, a method is provided for packaging a plurality of semiconductor die using a carrier having a plurality of device regions carried on an etchable substrate. The method comprises applying a body of a molding compound on the carrier so as to define a plurality of air cavities each disposed about a corresponding one of the device regions, attaching a corresponding one of the plurality of semiconductor die in each of the device regions, and electrically connecting each of the semiconductor die with at least one contact pad of each of the device regions exposed inside the corresponding one of the air cavities. The method further comprises etching the etchable substrate to define a contact surface for the at least one contact pad in each of the device regions from a portion of the etchable substrate such that the contact surface is accessible from a location external to the body.

In another aspect of the present invention, a method is provided for packaging a semiconductor die using a carrier having at least one device region carried on an etchable substrate. The method comprises applying a body of a molding compound on the carrier so as to define an air cavity disposed about the device region, attaching a semiconductor die in the device region, and electrically connecting the semiconductor die with a first surface of a contact pad in the device region that is at least partially exposed inside the air cavity. The method further comprises etching the etchable substrate to define a second surface of the contact pad from a portion of the etchable substrate such that the second surface is accessible from a location external to the body.

In yet another aspect of the present invention, a method is provided for packaging a plurality of semiconductor die using a carrier having a plurality of device regions carried on an etchable substrate. The method comprises attaching a first semiconductor die in a first device region, electrically connecting the first semiconductor die with at least one contact pad in the first device region, and applying a body of a molding compound on the carrier that defines an air cavity disposed about a second device region and encapsulates the first device region and the first semiconductor die. The method further comprises attaching a second semiconductor die to the second device region, electrically connecting the second semiconductor die with at least one contact pad of the second device region, and separating the device regions from the carrier to define a plurality of die packages each including a corresponding one of the device regions.

The accompanying drawings, which are incorporated in and constitute a part of this specification, illustrate embodiments of the invention and, together with a general description of the invention given above and the detailed description of the embodiments given below, serve to explain the principles of the invention.

The present invention provides methods for forming an air cavity package for a semiconductor die. The present invention will now be described in greater detail by referring to the drawings that accompany the present application.

Figure 1:
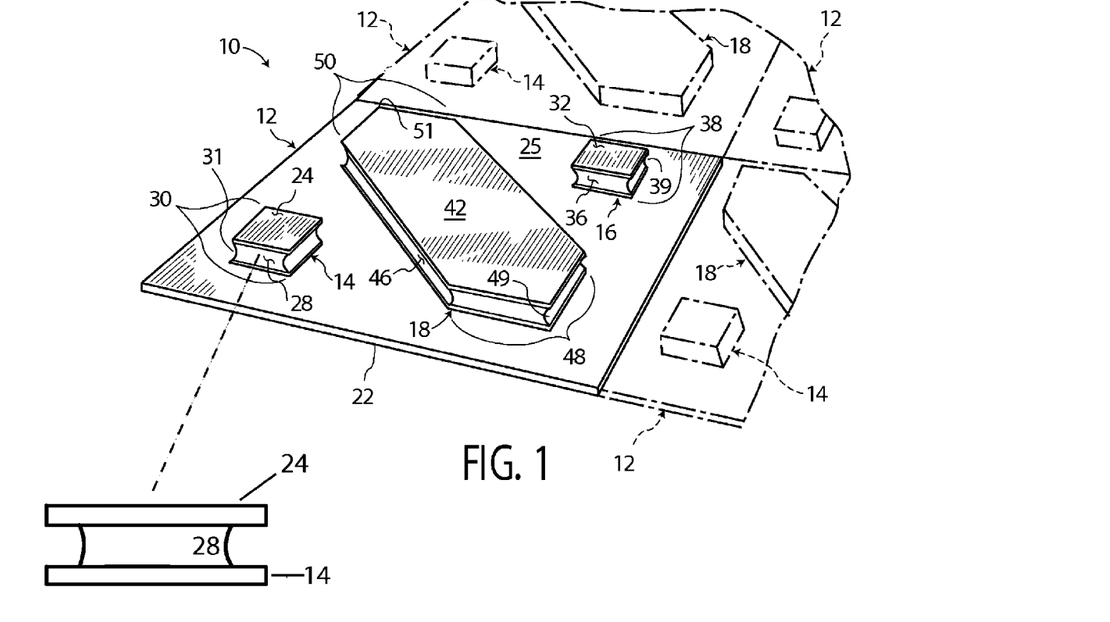
FIGS. 1 through 6 are diagrammatic views of a single device region of a carrier with multiple device regions depicted at various processing stages in accordance with an embodiment of the present invention.

With reference to FIG. 1 and in accordance with an embodiment of the present invention, a non-leaded carrier 10 includes a matrix or array of device regions, of which a single device region 12 is shown, arranged across a generally planar surface 25 of an etchable substrate or support 22. A plurality of contact pads 14, 16, 18 is arranged about the device region 12 and the other device regions 12 (FIG. 7) of the carrier 10. The contact pads 14, 16, 18 are employed to establish a connection with a semiconductor chip or die 20 (FIGS. 3 and 4) attached to the device region 12. The etchable support 22 comprises a first metal that may be etched by an appropriate wet or dry etching process selective to the metal or metals constituting the contact pads 14, 16, 18. The contact pads 14, 16, 18 project above the planar surface 25 of the etchable support 22.

Contact pad 14 includes a first surface 24 defined by a metallization layer, a second surface 26 (FIG. 6) opposite the first surface 24 and also defined by a metallization layer, and a side surface 28 coupling together the first and second surfaces 24, 26. The side surface 28 includes a locking feature, generally indicated by reference numeral 30, formed at the edge of the contact pad 14 and defined at least partially by the planar faces of the side surface 28 that intersect at an outside right angle corner 31. Similarly, contact pad 16 includes a first surface 32 defined by a metallization layer, a second surface 34 (FIG. 6) opposite the first surface 32 and also defined by a metallization layer, and a side surface 36 coupling together the first and second surfaces 32, 34. The side surface 36 includes a locking feature, generally indicated by reference numeral 38, formed at the edge of the contact pad 16 and defined at least partially by the planar faces of the side surface 36 that intersect at an outside right angle corner 39. The first surfaces 24, 32 are used for electrically coupling the contact pads 14, 16, respectively, with the semiconductor die 20. The second surfaces 26, 34 are used for electrically coupling the contact pads 14, 16, respectively, with a substrate (not shown), such as a printed wiring board.

The locking features 30, 38, 48, and 50, formed at the edge of contact pads 14, 16, and 18, in an example carrier, may have recesses formed in the side surfaces 28, 36, and 46. The top surfaces 24, 32, and 42 of the contact pads then form an over-hang. This over-hang may be patterned during the production of the carrier 22. When molding compound 55 is applied, the recesses are filled; as a result, the molding compound 55 is mechanically anchored to the carrier 22, leading to excellent adhesion and mechanical strength.

More discussion in connection with these recesses, which are a part of the locking features in the present disclosure, may be found in U.S. Pat. No. 7,176,582 (application Ser. No. 10/510,591) titled, "Semiconductor Device and Method of Manufacturing the Same," of Hendrik Klaas Kloen et al issued on Feb. 13, 2007 and is herein incorporated by reference in its entirety.

Contact pad 18, which is polygonal and elongate, includes a first surface 42 defined by a metallization layer, a second surface 44 (FIG. 6) opposite the first surface 42 and also defined by a metallization layer, and a side surface 46 coupling together the first and second surfaces 42, 44. The side surface 46 includes a diametrically-opposed pair of locking features, generally indicated by reference numerals 48, 50, formed at the edge of the contact pad 18 and defined at least partially by the planar faces of the side surface 46 that intersect at an outside right angle corner 49 and at an outside right angle corner 51. The second surfaces 26, 34, 44 of the respective contact pads 14, 16, 18 are constituted by respective portions of the etchable support 22, as described below.

The contact pads 14, 16, 18 of device region 12 may be formed by a conventional lithography and etching process at locations dispersed across the surface of carrier 10. For example, the contact pads 14, 16, 18 may be formed by applying a resist (not shown) on one or more metal layers applied to the etchable substrate 22, exposing the resist to a pattern of radiation, developing the transferred pattern in the exposed resist, and transferring the pattern to the metal layer(s) using the patterned resist as an etch mask for a wet or dry etching process that removes the metal(s) selective to the metal constituting the substrate 22.

Figure 2:
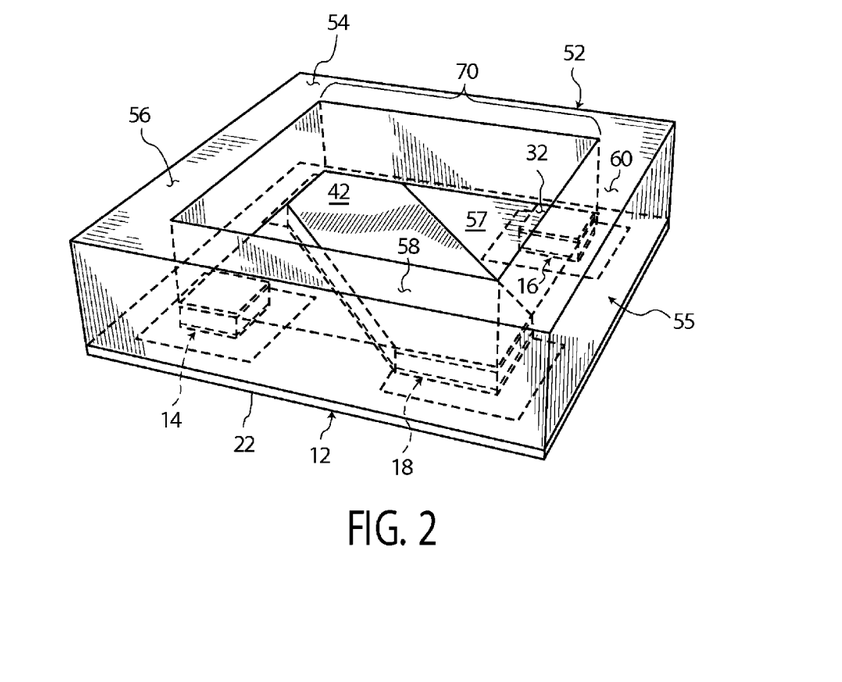

With reference to FIG. 2 in which like reference numerals refer to like features in FIG. 1 and at a subsequent processing stage, a body 55 consisting of a mass of a molding compound, such as an epoxy molding compound, is applied across the carrier 10 and cured. The patterned molding compound body is constructed with a plurality of air cavities, of which a single air cavity 70 and device region 12 are shown in FIG. 2, each of which envelopes a corresponding one of the device regions 12 on carrier 10. Air cavity 70 is registered with, and surrounds, the contact pads 14, 16, 18 of the device region 12. After singulation to define a die package 72, the air cavity 70 is surrounded by a floor 57 of molding compound from body 55 and a sidewall frame 52 that includes sidewalls 54, 56, 58, 60 of molding compound. The floor 57 is coextensive with etchable substrate 22 and extends vertically in a perpendicular direction from planar surface 25 of etchable substrate 22 to an elevation approximately level with but slightly below the respective surfaces 24, 32, 42 of contact pads 14, 16, 18. Before separation or singulation into individual die packages, the sidewall frame 52 is connected with the sidewall frames of adjacent device regions that are substantially identical to sidewall frame 52 and device region 12 (See FIGS. 7, 8) as a single-piece, unitary mass with selvage molding compound between adjacent device regions 12 that is excised during package singulation.

Sidewalls 54, 56, 58, 60 have a generally rectangular arrangement with inside right angle corners such that the sidewall frame 52 contacts and engages locking features 30, 38, 48, 50. The locking features 30, 38, 48, 50 assist in creating a firm attachment between the cured molding material of the sidewall frame 52 and the carrier 10. After singulation, the firm attachment substantially prohibits vertical and horizontal motion of the sidewall frame 52 relative to the carrier 10, where "vertical" means substantially perpendicular to surface 25 and "horizontal" means substantially parallel to surface 25. As a result, the sidewall frame 52 stays in place after being disposed and cured around the device region 12 of the carrier 10 and after singulation.

The patterned body 55 of molding compound may be applied to the carrier 10 by any suitable molding technique as understood by a person having ordinary skill in the art. For example, the molding compound body 55 may be formed by transfer or injection molding over the carrier 10 with features inside the mold cavity that define the air cavities 70. The air cavities 70 in the molding compound body 55 are defined such that the semiconductor die 20 remains accessible for wire bonding in a subsequent processing stage and such that the respective surfaces 24, 32, 42 of contact pads 14, 16, 18 are not contaminated with molding compound. Following transfer molding, the molding compound is cured and at least partially hardened, using techniques that are known in the art, such as oven curing.

Figure 3:
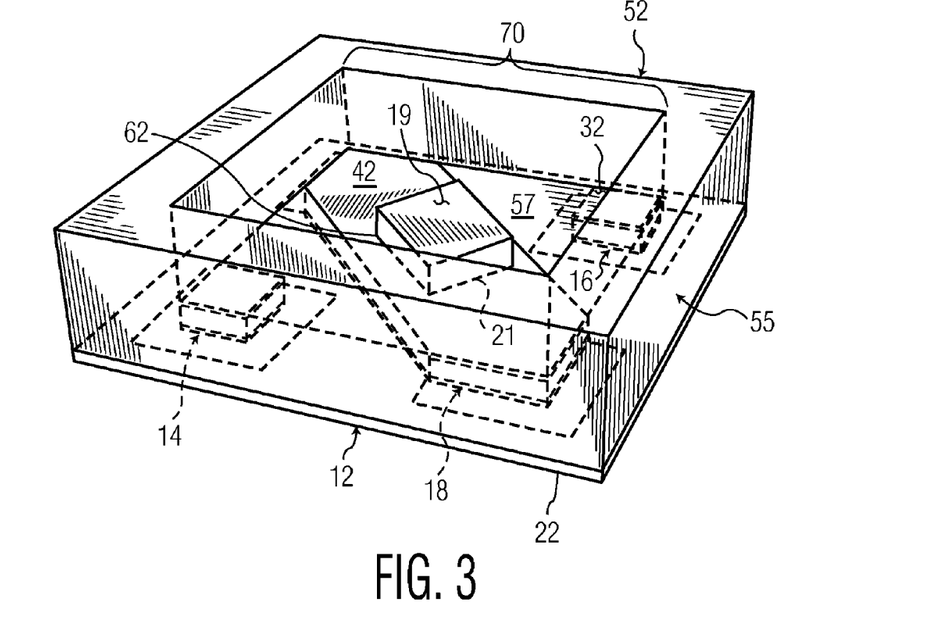

With reference to FIG. 3 in which like reference numerals refer to like features in FIG. 2 and at a subsequent processing stage, the semiconductor die 20 is attached to a central die attach pad 62 on the central contact pad 18 by, for example, a conductive or non-conductive adhesive layer (not shown) or a high-temperature, heat-conductive solder, often a eutectic solder. The conductive adhesive layer provides a direct electrical connection, if applicable, or improves thermal performance, or both, between the back face of the semiconductor die 20 and the die attach pad 62. The contact pads 14, 16 and metallized portions (not shown) of the central contact pad 18 about the die attach pad 62 are used to establish electrical signal connections with a front face 19 of the semiconductor die 20 and the die attach pad 62 is used to establish an electrical ground connection with a rear face 21 of the semiconductor die 20. The semiconductor die 20 may be a high frequency (e.g., radio-frequency or RF) semiconductor chip or may include any other type of integrated circuit that would derive a benefit from operating in an air dielectric environment.

Figure 4:
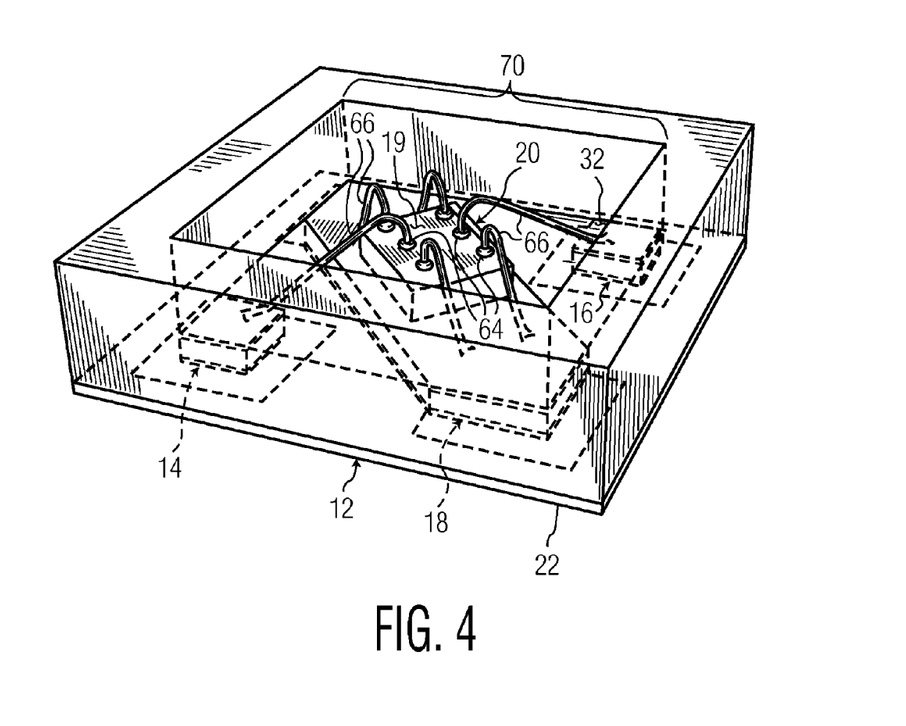
Figure 6:
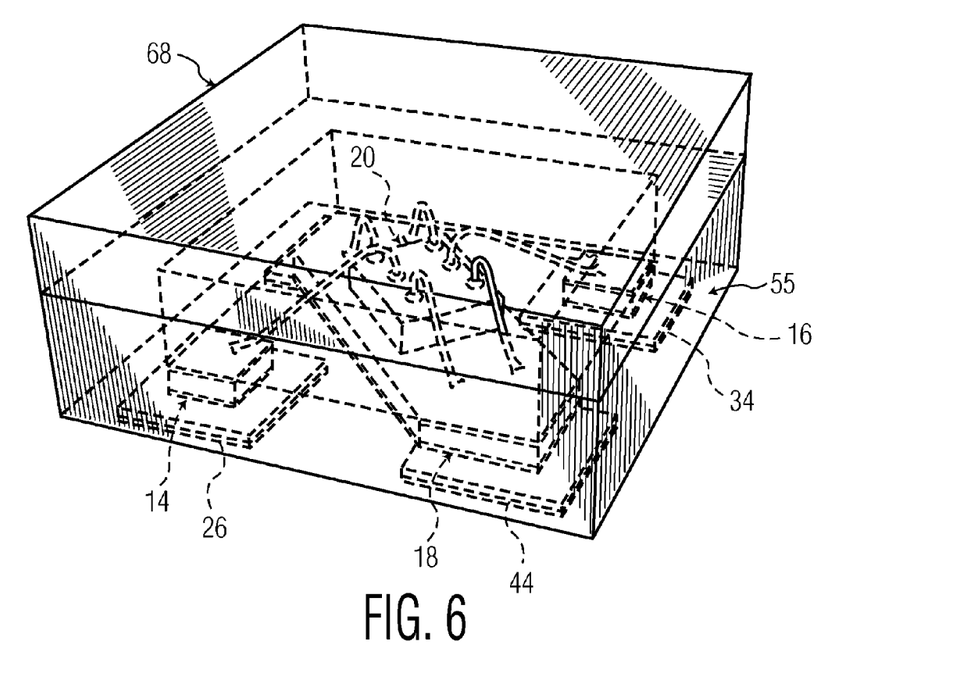

With reference to FIG. 4 in which like reference numerals refer to like features in FIG. 3 and at a subsequent processing stage, bond pads 64 on the exposed top surface of the semiconductor die 20 are electrically coupled by leads or bond wires 66 with surfaces 24, 32, 42 on the contact pads 14, 16, 18, respectively, for coupling the die circuitry with metallized regions on the external contact surfaces 26, 34, 44 (FIG. 6). The bond wires 66 may be formed from a ductile conductor selected from gold, copper, aluminum, and alloys of these metals. Wire bonding processes used in packaging are familiar to a person having ordinary skill in the art.

Figure 5:
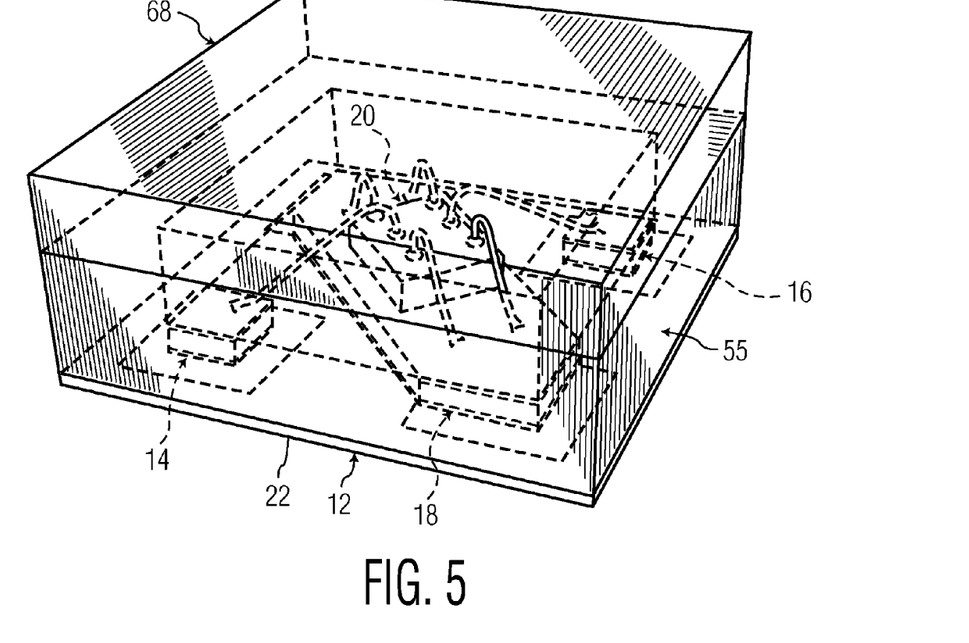
Figure 7:
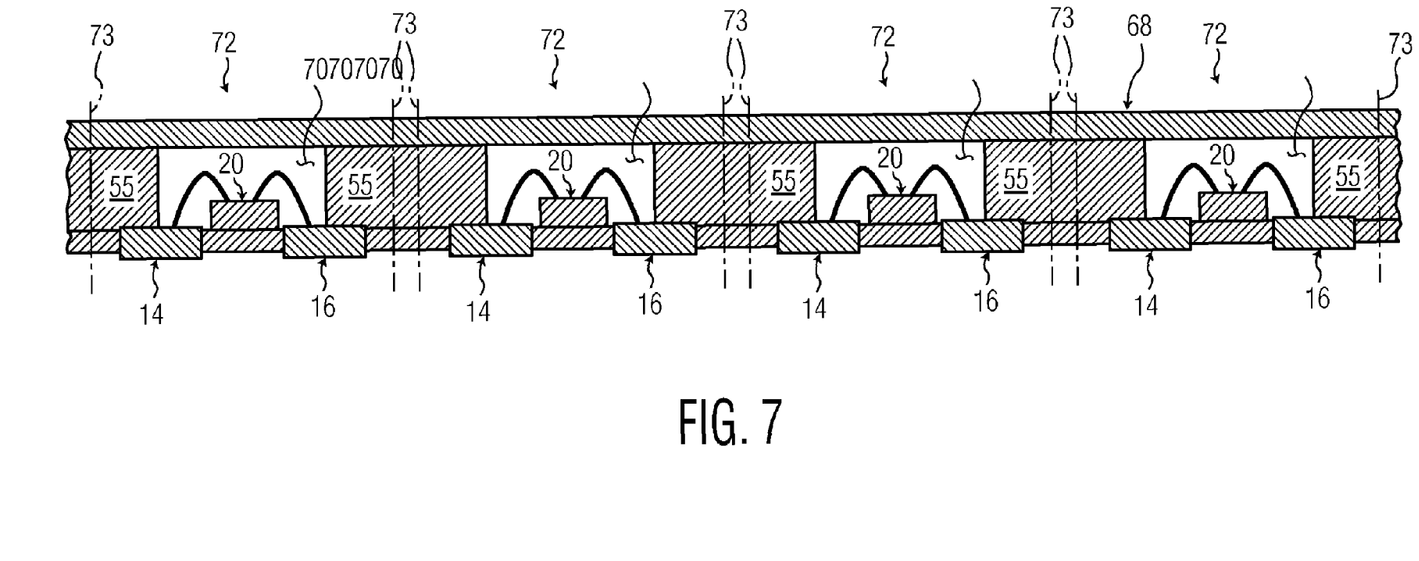
FIG. 7 is a diagrammatic cross-sectional view of the carrier of FIG. 6 depicting multiple device regions.

With reference to FIG. 5 in which like reference numerals refer to like features in FIG. 4 and at a subsequent processing stage, a cover or lid 68 is bonded with the molding compound body 55 to enclose the open top of the air cavity 70 containing the semiconductor die 20. The lid 68 also closes the open top of other air cavities 70 disposed in molding compound body 55, as best depicted in FIG. 7. A top surface of the molding compound body 55 may be adhesively bonded with the underside of the lid 68. The lid 68 may be constituted by a sheet of cured molding compound that is overmolded across the molding compound body 55 or may be an applied tape. An underside of the lid 68 is spaced vertically above the semiconductor die 20 and bond wires 66 in a non-contacting relationship.

With reference to FIG. 6 in which like reference numerals refer to like features in FIG. 5 and at a subsequent processing stage, portions of the etchable substrate 22 are removed using a conventional lithography and wet or dry etching process that protects portions of the substrate 22 with a patterned etch mask and removes unprotected metal constituting substrate 22 selective to the metal constituting the contact pads 14, 16, 18, and the molding compound of sidewall frame 52 and floor 57. Protected portions of the substrate 22, which are masked by the patterned etch mask during the etching process, are coextensive with the contact pads 14, 16, 18 and constitute the second surface 26 of contact pad 14, the second surface 34 of contact pad 16, and the second surface 44 of contact pad 18. Etching is a subtractive process in the course of which portions of the substrate 22 are either dissolved in liquid chemicals (i.e., wet etching) or converted into volatile gaseous compound (i.e., dry etching). After formation, the second surfaces 26, 34, 44 are exposed and accessible through the floor 57 and sidewall frame 52 of molding compound. Metallization areas may be applied to the contact pads 14, 16, 18 that operate as external electrical contacts with the circuitry of the semiconductor die 20 inside the die package 72 (FIG. 7). These metallization areas may also operate as a patterned etch mask used to define the second surface 26 of contact pad 14, the second surface 34 of contact pad 16, and the second surface 44 of contact pad 18, each of which establishes an external contact to the semiconductor die 20 that is accessible from outside of the patterned body 55 of molding compound.

The removal of the substrate 22 may constitute a portion of a fabrication process as described in afore-mentioned U.S. Pat. No. 7,176,582. The invention, however, is not so limited as the principles of the invention are applicable to other matrix package designs, such as quad flat no-lead (QFN) packages.

With reference to FIG. 7 in which like reference numerals refer to like features in FIG. 6 and at a subsequent processing stage, the completed structure includes a plurality of substantially identical chip or die packages 72, each of which includes one semiconductor die 20 situated inside a corresponding air cavity 70. A singulating operation is performed to separate or singulate the individual die packages 72 generally along each pair of lines 73. The singulating operation may be performed using a technique, such as sawing using a wafer saw, known to a person having ordinary skill in the art, having a blade with a cutting width approximately equal to the distance between adjacent pairs of lines 73, which represent molding compound selvage used to merely couple the adjacent die packages 72 until singulation. The die packages 72 may be mounted, after being singulated, to a substrate, such as a printed wiring board (not shown).

Semiconductor die 20 is immersed in an air dielectric inside the air cavity 70, which improves electrical performance of certain types of semiconductor die 20 like high frequency (e.g., radio-frequency or RF) semiconductor chips. The lid 68 and the floor 57 and sidewall frame 52 of body 55 comprise a mass of molding compound bounding the air cavity 70 to seal the die package 72 against the intrusion of water vapor and other atmospheric gases. Packaging the semiconductor die 20 in an envelope of encapsulated air improves the high frequency properties of the semiconductor die 20 and its bond wires 66, as opposed to being surrounded by or encased in a mass of molding compound. Dry air has a considerably lower dielectric constant than molding compounds, which promotes consistent and reliable performance at high current densities.

Figure 8:
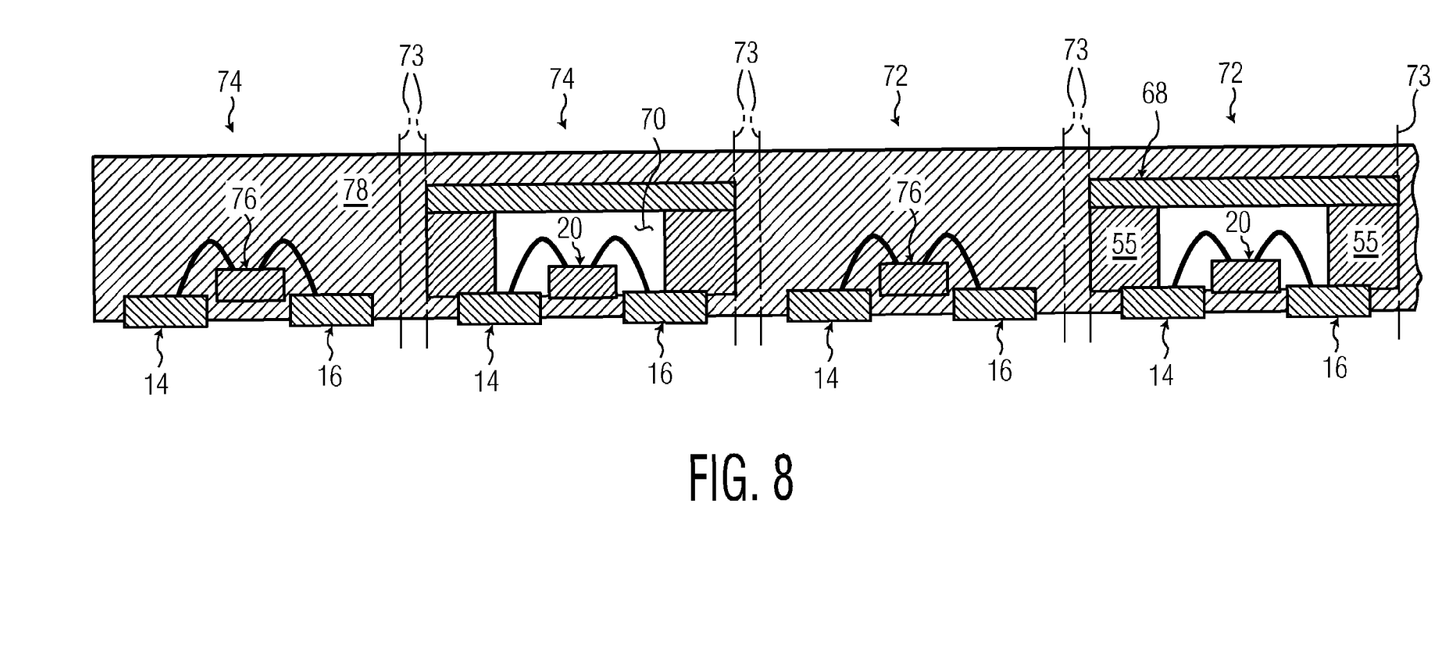
FIG. 8 is a diagrammatic cross-sectional view of a carrier similar to the carrier of FIG. 7 in accordance with an alternative embodiment of the present invention.

With reference to FIG. 8 in which like reference numerals refer to like features in FIG. 7 and at a subsequent processing stage, the completed structure may also include a plurality of die packages 74 that are each encapsulated by a portion of a body 78 of molding compound, which may comprise a portion of the patterned body 55. Each of the die packages 74 contains a semiconductor die 76 that fails to gain an advantage due to operation in an air cavity, similar to air cavity 70. The semiconductor die 76 is contacted by molding compound body 78 such that die 76 is fully encased or encapsulated in the molding compound body 78 with no air gaps or air spaces between the die 76 and the molding compound. The fabrication procedure may be performed such that die packages 74 are formed on the same carrier 10 as die packages 72, each of which includes one semiconductor die 20 situated inside a corresponding air cavity 70. Consequently, the fabrication method of the present invention may be used to form air cavity die packages 72 and non-air cavity die packages 74 on a single carrier 10 that are singulated or separated after formation.

In this alternative embodiment of the present invention, each of the semiconductor die 76 is attached in a corresponding one of the device regions 12 and electrically connected by wirebonding with the contact pads 14, 16, 18 in device region 12. The body 55 of molding compound is applied on the carrier 10 so as to define at least one air cavity 70 disposed about another device region 12 and the contact pads 14, 16, 18. The body 55 further includes body 78 that encapsulates each of semiconductor die 76 and its associated device region 12. Each of a plurality of different semiconductor die 20 is attached inside each of the air cavities 70 and is electrically coupled with the surfaces 24, 32, 42 of contact pads 14, 16, 18, which are exposed inside each of the air cavities 70. The etchable substrate 22 is etched to define contact surfaces 26, 34, 44 accessible from a location external to the body 55 for each of the contact pads 14, 16, 18, respectively, from a portion of the etchable substrate 22.

Advantageously, all of the die package fabrication steps may be performed in an array or matrix format in which multiple die packages are processed simultaneously in a two-dimensional matrix or array. Specifically, multiple air cavities are defined in a body of molding compound that is applied across multiple device regions on a carrier of leadframe. A cover is applied to simultaneously close all air cavities. The singulation operation that divides the carrier into constituent die packages can cut or saw through molding compound, as opposed to another material such as a ceramic or a printed wiring board. The die packages of the present invention may be made smaller and more compact than conventional packages. The present invention is flexible in that semiconductor die that do not require air cavities may be packaged on the same carrier as die that benefit from operation in an air cavity.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A die package comprising:
   a semiconductor die;
   a carrier supporting the semiconductor die, the carrier including a plurality of contact pads each having a first surface coupled electrically with the semiconductor die and a second surface coupled electrically with the first surface, and the contact pads defining a plurality of locking features surrounding the semiconductor die;
   and a body comprising a molding compound arranged about the semiconductor die to at least partially bound an air cavity for the semiconductor die, the body disposed on the carrier such that the second surface of each of the contact pads is externally exposed from the die package, and the body coupled mechanically with the locking features for securing the molding compound to the carrier.

2. The die package of claim 1 wherein the body further comprises:
   a sidewall frame including a plurality of sidewalls arranged about the semiconductor die.

3. The die package of claim 2 wherein each of the contact pads includes a sidewall extending between the first surface and the second surface, and each of the locking features further comprises a portion of the sidewall of a corresponding one of the contact pads, the sidewall portions coupled with the sidewalls of the sidewall frame.

4. The die package of claim 2 further comprising:
   a cover attached to the sidewall frame to close the air cavity.

5. The die package of claim 4 wherein the body includes a floor extending between the sidewalls, the second surface of each of the contact pads exposed through the floor, and the semiconductor die positioned in the air cavity between the cover and the floor.

6. The die package of claim 4 wherein the cover comprises the molding compound.

7. The die package of claim 1 wherein each of the contact pads includes a sidewall extending between the first surface and the second surface, and each of the locking features further comprises a portion of the sidewall.

8. The die package of claim 1 wherein the semiconductor die further comprises a high frequency semiconductor chip.

9. A method for packaging a plurality of semiconductor die using a carrier having a plurality of device regions carried on an etchable substrate, the method comprising:
   applying a body of a molding compound on the carrier so as to define a plurality of air cavities each disposed about a corresponding one of the device regions;
   attaching a corresponding one of the plurality of semiconductor die in each of the device regions;
   electrically connecting each of the semiconductor die with at least one contact pad of each of the device regions exposed inside the corresponding one of the air cavities;
   and etching the etchable substrate to define a contact surface for the at least one contact pad in each of the device regions from a portion of the etchable substrate such that the contact surface is accessible from a location external to the body.

10. The method of claim 9 further comprising:
    separating the device regions from the carrier to define a plurality of die packages each including a corresponding one of the device regions.

11. The method of claim 10 wherein separating the device regions further comprises:
    cutting the body to shape the molding compound for defining a plurality of sidewall frames each extending about a corresponding one of the device regions to partially define a corresponding one of the air cavities.

12. The method of claim 11 further comprising:
applying a cover to the sidewall to close all of the air cavities after the plurality of semiconductor die are electrically connected.

13. The method of claim 9 wherein the plurality of semiconductor die further comprises a plurality of high frequency semiconductor die.

14. The method of claim 9 further comprising:
locking the molding compound of the body to the carrier.

15. The method of claim 14 wherein at least one of the device regions includes a plurality of locking features arranged about the semiconductor die, and applying the body of the molding compound further comprises:
engaging the molding compound of the body with the locking features.

16. The method of claim 15 wherein the contact pads further comprise the locking features.

17. The method of claim 9 further comprising:
applying a cover to the body to close all of the air cavities after the plurality of semiconductor die are electrically connected.

18. The method of claim 9 wherein applying the body further comprises:
molding a unitary mass of the molding compound across the device regions of the carrier;
and curing the unitary mass of molding compound to define the body.

19. A method for packaging a semiconductor die using a carrier having at least one device region carried on an etchable substrate, the method comprising:
applying a body of a molding compound on the carrier so as to define an air cavity disposed about the device region;
attaching a semiconductor die in the device region;
electrically connecting the semiconductor die with a first surface of a contact pad in the device region that is at least partially exposed inside the air cavity;
and etching the etchable substrate to define a second surface of the contact pad from a portion of the etchable substrate such that the second surface is accessible from a location external to the body.

20. The method of claim 19 wherein the semiconductor die further comprises a high frequency semiconductor die.

21. The method of claim 19 further comprising:
locking the molding compound of the body to the carrier with a locking feature of the contact pad.

22. A method for packaging a plurality of semiconductor die using a carrier having a plurality of device regions carried on an etchable substrate, the method comprising:
attaching a first semiconductor die in a first device region;
electrically connecting the first semiconductor die with at least one contact pad in the first device region;
applying a body of a molding compound on the carrier that defines an air cavity disposed about a second device region and encapsulates the first device region and the first semiconductor die;
attaching a second semiconductor die to the second device region;
electrically connecting the second semiconductor die with at least one contact pad of the second device region;
and separating the device regions from the carrier to define a plurality of die packages each including a corresponding one of the device regions.

23. The method of claim 22 further comprising:
applying a cover to the body of the molding compound to close the air cavity after the second semiconductor die in the second device region is electrically connected.

24. The method of claim 22 further comprising:
etching the etchable substrate to define a contact surface accessible from a location external to the body of the molding compound for the at least one contact pad of the first and second device regions from a portion of the etchable substrate.

25. The method of claim 22 further comprising:
locking the molding compound of the body to the carrier with at least one locking feature that comprises a portion of the at least one contact pad of the second device region.

* * * * *